United States Patent
Nakamura et al.

(10) Patent No.: US 11,552,448 B2
(45) Date of Patent: Jan. 10, 2023

(54) SEMICONDUCTOR OPTICAL AMPLIFIER INTEGRATED LASER

(71) Applicant: Lumentum Japan, Inc., Kanagawa (JP)

(72) Inventors: Atsushi Nakamura, Nagano (JP); Kaoru Okamoto, Kanagawa (JP); Masatoshi Arasawa, Tokyo (JP); Tetsuya Nishida, Tokyo (JP); Yasushi Sakuma, Tokyo (JP); Shigetaka Hamada, Kanagawa (JP); Ryosuke Nakajima, Kanagawa (JP)

(73) Assignee: Lumentum Japan, Inc., Kanagawa (JP)

( * ) Notice: Subject to any disclaimer, the term of this patent is extended or adjusted under 35 U.S.C. 154(b) by 282 days.

(21) Appl. No.: 16/901,872

(22) Filed: Jun. 15, 2020

(65) Prior Publication Data
US 2021/0234333 A1    Jul. 29, 2021

(30) Foreign Application Priority Data

Jan. 28, 2020  (JP) ............................. JP2020-011661
Apr. 30, 2020  (JP) ............................. JP2020-080669

(51) Int. Cl.
*H01S 5/026*      (2006.01)
*H01S 5/50*       (2006.01)
(Continued)

(52) U.S. Cl.
CPC ............ *H01S 5/026* (2013.01); *H01S 5/0265* (2013.01); *H01S 5/12* (2013.01); *H01S 5/227* (2013.01);
(Continued)

(58) Field of Classification Search
CPC ......... H01S 5/50–509; H01S 5/12–125; H01S 5/227–2277; H01S 5/1021; H01S 5/026
See application file for complete search history.

(56) References Cited

U.S. PATENT DOCUMENTS

| 5,349,598 A | * | 9/1994 | Ouchi | ................... H01S 5/1032 372/45.01 |
| 6,008,675 A | * | 12/1999 | Handa | ...................... H01S 5/12 372/27 |

(Continued)

FOREIGN PATENT DOCUMENTS

JP    2017-157583 A    9/2017

*Primary Examiner* — Joshua King
*Assistant Examiner* — Sean P Hagan
(74) *Attorney, Agent, or Firm* — Harrity & Harrity, LLP (57) ABSTRACT

A semiconductor optical amplifier integrated laser includes a semiconductor laser oscillator portion that oscillates laser light having a wavelength included in a gain band and a semiconductor optical amplifier portion that amplifies laser light output from the semiconductor laser oscillator portion. The semiconductor laser oscillator portion and the semiconductor optical amplifier portion have one common p-i-n structure, the common p-i-n structure includes an active layer, a cladding layer provided apart from the active layer, and a common functional layer formed in the cladding layer, and the common functional layer includes a first portion that reflects light having a wavelength within the gain band in the semiconductor laser oscillator portion and a second portion that transmits light having a wavelength within the gain band in the semiconductor optical amplifier portion.

14 Claims, 8 Drawing Sheets (51) Int. Cl.
    *H01S 5/32*       (2006.01)
    *H01S 5/227*     (2006.01)
    *H01S 5/12*       (2021.01)
    *H01S 5/10*       (2021.01)
    *H01S 5/028*     (2006.01)

(52) U.S. Cl.
    CPC .............. *H01S 5/3211* (2013.01); *H01S 5/50* (2013.01); *H01S 5/0287* (2013.01); *H01S 5/1064* (2013.01)

(56) References Cited

U.S. PATENT DOCUMENTS

| | | | |
|---|---|---|---|
| 6,208,793 B1* | 3/2001 | Hillmer | H01S 5/4031 385/24 |
| 2003/0219054 A1* | 11/2003 | Capasso | H01S 5/3402 372/50.22 |
| 2011/0157685 A1* | 6/2011 | Sugawara | H01S 5/12 359/344 |
| 2017/0250521 A1 | 8/2017 | Nakamura et al. | |

* cited by examiner

SEMICONDUCTOR OPTICAL AMPLIFIER INTEGRATED LASER

CROSS-REFERENCE TO RELATED APPLICATIONS

The present application claims priority from Japanese application JP 2020-011661, filed on Jan. 28, 2020 and JP 2020-080669, filed on Apr. 30, 2020, which are hereby expressly incorporated by reference herein.

TECHNICAL FIELD

The present disclosure relates to a semiconductor optical amplifier integrated laser.

BACKGROUND

A semiconductor optical amplifier integrated laser is a semiconductor device in which a semiconductor laser and a semiconductor optical amplifier are integrally formed. The semiconductor optical amplifier integrated laser is small in size and low in power, can operate in any wavelength band of 1.3 µm and 1.55 µm, and can perform a nonlinear operation such as wavelength conversion, and thus, the semiconductor optical amplifier integrated laser has been receiving attention in recent years.

An optical transmitter module may reduce noise and may include a first semiconductor layer provided with a first electrode, an active layer formed in a stripe shape on the first semiconductor layer, and a second semiconductor layer on the active layer including a grating which is formed in a stripe shape, provided with a second electrode and provided along the extending direction of the active layer, wherein the active layer includes a first portion extending with a first stripe width from one end surface, a second portion extending with a second stripe width smaller than the first stripe width from the opposite side of the one end surface, and a connection portion connecting the first portion and the second portion, and the grating overlaps the first portion and does not overlap the second portion in a plan view.

SUMMARY

As a semiconductor optical amplifier integrated into a semiconductor laser or a modulator-integrated semiconductor laser has attracted attention, improvements in the characteristics of the semiconductor optical amplifier have been demanded. Specifically, it is required to increase the optical output increase amount (the input and output difference of the optical amplifier) with respect to the injection current to the semiconductor optical amplifier.

In order to efficiently amplify the laser light of the semiconductor laser, it is preferable that the gain band of the semiconductor optical amplifier (wavelength range of the gain spectrum) and the gain band of the semiconductor laser are close to each other. Further, considering the simplicity of the wafer process and the wafer process cost, it is desirable that the semiconductor optical amplifier and the semiconductor laser have the same active layer.

When a semiconductor optical amplifier is integrated into a distributed feedback laser diode (DFB-LD) that can obtain a single wavelength output, a grating is created only in the DFB-LD portion while no grating is formed in the optical amplifier portion. This is because the formation of the grating in the semiconductor optical amplifier portion causes return light from the semiconductor optical amplifier portion to the DFB-LD portion, which makes the oscillation of the DFB-LD unstable.

A floating type structure is known as a grating structure that has good structure controllability during fabrication. The floating type grating structure is, for example, a p-type cladding layer in which a grating is formed of a different material than that of the cladding layer. Since the layers constituting the grating can control the film thickness during multilayer growth, the controllability of the thickness of the grating layer is high, and the floating type grating structure is widely applied to the grating structure of the DFB-LD portion.

For example, in order to make the DFB-LD portion and the semiconductor optical amplifier portion to have a common active layer portion, the portions are simultaneously formed by one-time multilayer growth. At this time, from the viewpoint of the reliability of the semiconductor layer that has been grown in multiple layers, it is preferable to grow up to the grating layer that forms the grating after one-time multilayer growth. The grating layer is etched only in the DFB-LB portion to have a period corresponding to a desired oscillation wavelength, thereby forming a grating structure. On the other hand, in the semiconductor optical amplifier portion, the grating layer is entirely removed by etching.

However, the structure in which the semiconductor optical amplifier is integrated into the DFB-LD portion having the floating grating may have the following problems.

The first problem may be that the presence or absence of the grating layer makes the doping profile different. Since the floating type grating layer in the upper cladding layer generally suppresses the diffusion of the dopant, the diffusion profile of the dopant is affected by the presence or absence of the floating type grating layer. The doping profile is one of the most important parameters for laser characteristics and gain characteristics (for example, optical output intensity, threshold current, and the like). The different doping profiles mean that the doping profiles for both the DFB-LD portion and the semiconductor optical amplifier portion cannot be optimized at the same time. This becomes a more serious problem when the upper cladding layer is p-type.

The second problem may be that the presence or absence of the grating layer makes the current density of the active layer different for the same voltage. In the semiconductor optical amplifier integrated laser, current injection into the DFB-LD portion and the semiconductor optical amplifier portion may be conducted via a single electrode. When driving the DFB-LD portion and the semiconductor optical amplifier portion with the single electrode, the floating-type grating layer serves as a current injection barrier, and thus, the current density of the active layer becomes different for the same voltage due to the presence or absence of the grating layer. The current density is a very important parameter that determines the reliability of the semiconductor optical amplifier integrated laser, and the non-uniformity of the current density adversely affects the reliability.

According to some possible implementations, a semiconductor optical amplifier integrated laser may include a semiconductor laser oscillator portion that oscillates laser light having a wavelength included in a gain band; and a semiconductor optical amplifier portion that amplifies laser light output from the semiconductor laser oscillator portion, wherein the semiconductor laser oscillator portion and the semiconductor optical amplifier portion have one common p-i-n structure, the common p-i-n structure includes an active layer, a cladding layer provided apart from the active layer, and a common functional layer formed in the cladding layer, and the common functional layer includes a first portion that reflects light having a wavelength within the gain band in the semiconductor laser oscillator portion and a second portion that transmits light having a wavelength within the gain band in the semiconductor optical amplifier portion.

According to some possible implementations, a semiconductor optical amplifier integrated laser may include a substrate having a first conductivity type; an active layer formed on the first surface of the substrate; a second conductivity type cladding layer formed on the active layer; a common functional layer formed in the cladding layer and separated from the active layer; a first conductivity type electrode provided on a second surface opposite to the first surface; and a second conductivity type electrode provided on the cladding layer, wherein the semiconductor optical amplifier integrated laser includes a first domain and a second domain optically connected to the first domain, and the common functional layer includes a first portion that reflects light having a specific wavelength within a gain band of the active layer in the first domain and a second portion that transmits light having a specific wavelength within the gain band of the active layer in the second domain.

DETAILED DESCRIPTION

Figure 1:
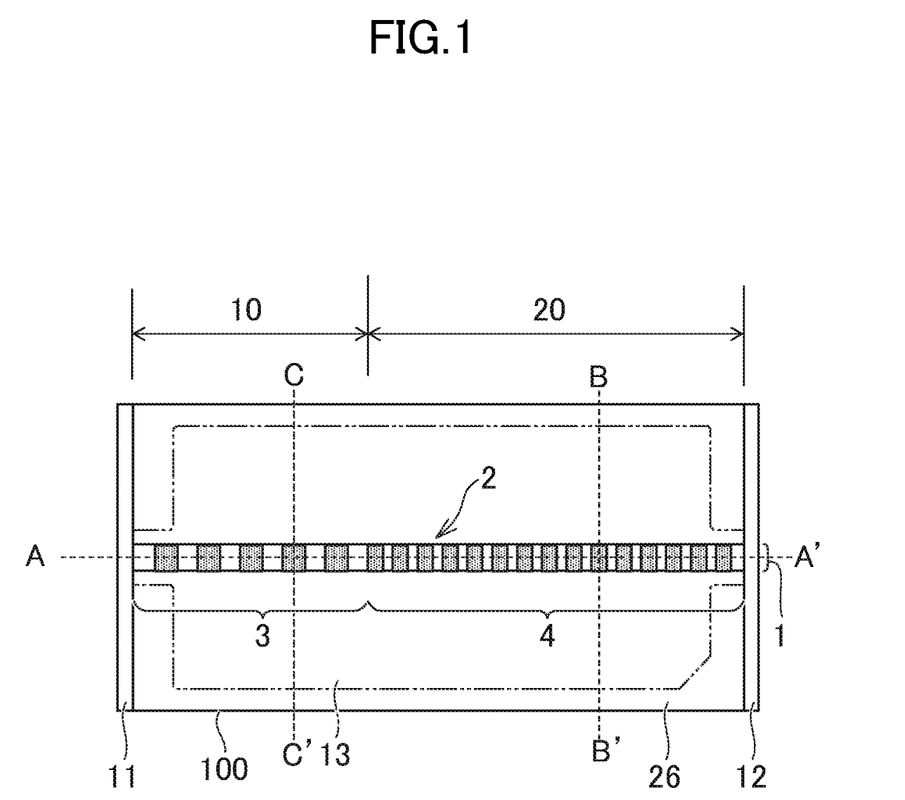
FIG. 1 is an example of a plan view of a semiconductor optical amplifier integrated laser according to a first example.
Figure 2:
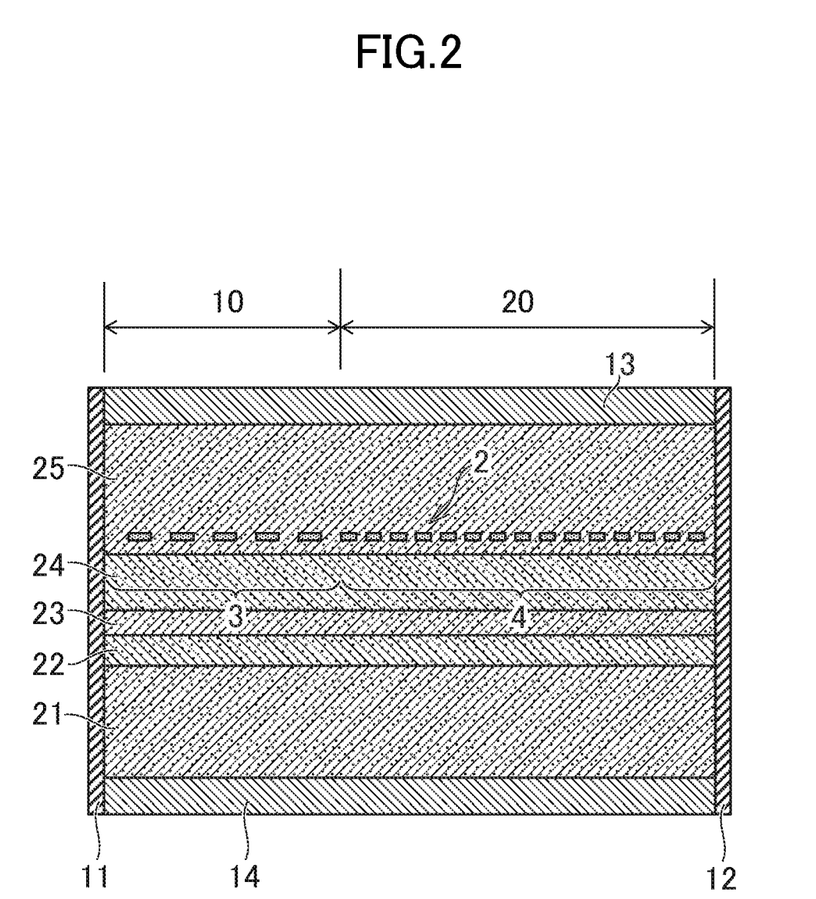
FIG. 2 is a schematic cross-sectional view taken along the line A-A' of the semiconductor optical amplifier integrated laser of FIG. 1.
Figure 3:
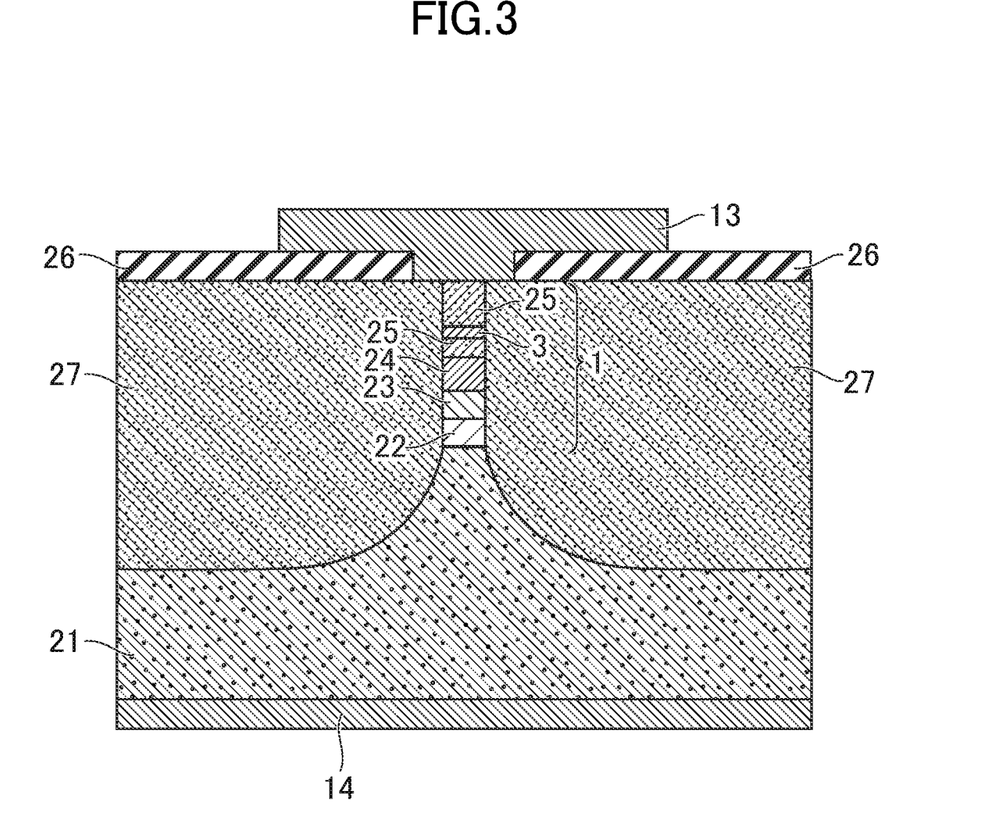
FIG. 3 is a schematic cross-sectional view taken along the line B-B' of the semiconductor optical amplifier integrated laser of FIG. 1.

FIG. 1 shows a plan view of a semiconductor optical amplifier integrated laser. FIG. 2 shows a schematic cross-sectional view taken along the line A-A' of FIG. 1. FIG. 3 shows a schematic cross-sectional view taken along the line B-B' in FIG. 1, and FIG. 4 shows a schematic cross-sectional view taken along the line C-C' in FIG. 1.

Referring to FIG. 1, a semiconductor optical amplifier integrated laser 100 includes a semiconductor laser oscillator portion 20 that oscillates light having a predetermined wavelength, and a semiconductor optical amplifier portion 10 that amplifies the laser-oscillated light. In the present implementation, the semiconductor laser oscillator portion 20 is a DFB laser diode (DFB-LD).

The semiconductor laser oscillator portion 20 and the semiconductor optical amplifier portion 10 have one common p-i-n structure. "One common p-i-n structure" means a p-i-n structure made of the same material and formed by the same process. Since the semiconductor laser oscillator portion 20 and the semiconductor optical amplifier portion 10 have one common structure, the gain band of the semiconductor laser oscillator portion 20 and the gain band of the semiconductor optical amplifier portion 10 are substantially the same. Here, the gain band indicates a wavelength range of the gain spectrum. The semiconductor optical amplifier integrated laser 100 also includes a low reflection end surface coating film 11 provided on the laser emission surface and a high reflection end surface coating film 12 on the surface opposite to the laser emission surface. In the present implementation, the oscillation wavelength of the semiconductor laser oscillator portion 20 is 1.3 μm band, but the oscillation wavelength may be 1.55 μm band.

Figure 4:
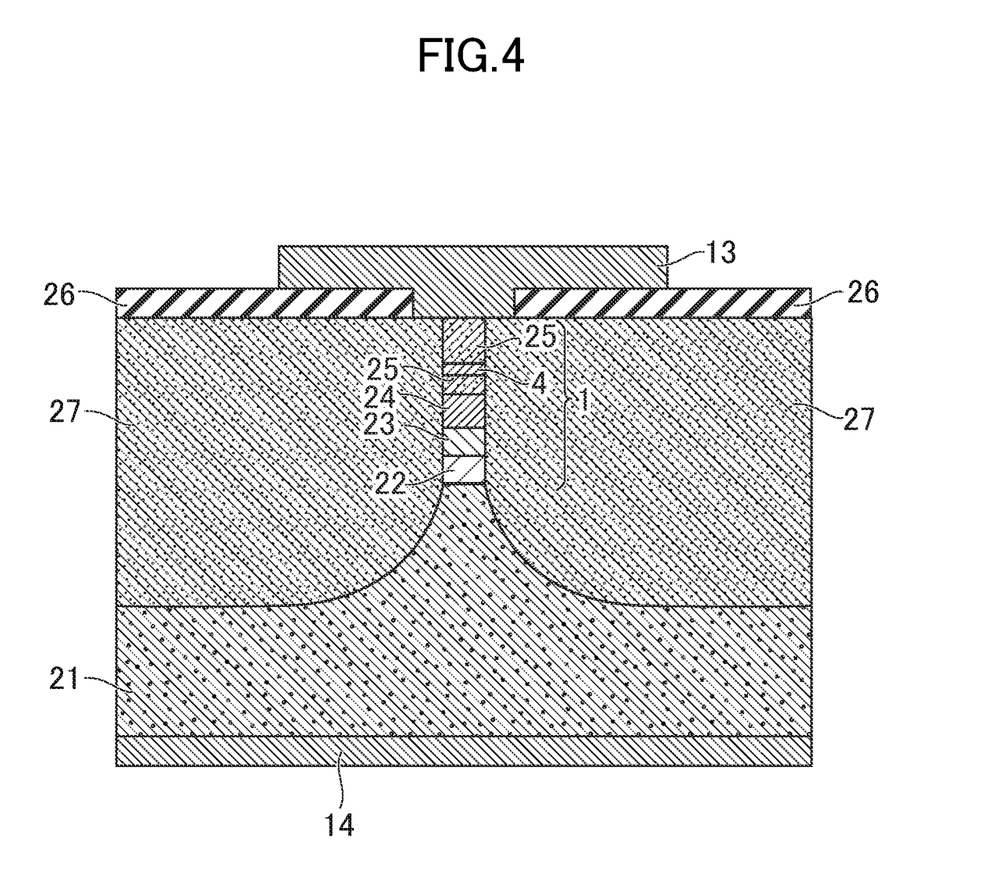
FIG. 4 is a schematic cross-sectional view taken along the line C-C' of the semiconductor optical amplifier integrated laser of FIG. 1.

As shown in FIGS. 3 and 4, the semiconductor optical amplifier integrated laser 100 includes a mesa unit 1 and a buried layer 27 that embeds the mesa unit 1 from both sides. The semiconductor optical amplifier integrated laser 100 further includes an insulating film 26 that covers a part of the buried layer 27, and an electrode 13 that covers a part of the mesa unit 1 and the insulating film 26. The solid line that defines the mesa unit 1 represents the contour of the mesa unit 1.

Referring to FIG. 2, the semiconductor optical amplifier integrated laser 100 has a first conductivity type substrate 21 and a p-i-n structure provided on the first conductivity type substrate 21. In the present implementation, the p-i-n structure includes a first conductivity type SCH layer 22, an active layer 23, a second conductivity type SCH layer 24, and a second conductivity type cladding layer 25, but the present disclosure is not limited thereto. In this implementation, the first conductivity type is n-type, the second conductivity type is p-type, and the first conductivity type substrate 21 is n-InP. The first conductivity type SCH layer 22 is n-InGaAsP, the active layer 23 is a multiple quantum well made of InGaAsP or InGaAlAs, the second conductivity type SCH layer 24 is p-InGaAsP, and the second conductivity type cladding layer 25 is p-InP. Further, the second conductivity type dopant is Zn. Further, the composition of InGaAsP or InGaAlAs in the active layer 23 is adjusted to emit light at 1.3 μm, but when emitting at another wavelength, it is adjusted to emit at that wavelength.

The semiconductor optical amplifier integrated laser 100 further includes a first conductivity type electrode 14 provided on the lower surface of the first conductivity type substrate 21 and the second conductivity type electrode 13 provided on the p-i-n structure. The electrodes 13 and 14 are used to inject a current from an external power source (not shown) into the semiconductor optical amplifier integrated laser 100 (semiconductor laser oscillator portion 20 and semiconductor optical amplifier portion 10). Each of the electrodes 13 and 14 is composed of one member. That is, the semiconductor optical amplifier portion 10 and the semiconductor laser oscillator portion 20 are energized by a common electrode. Although the substrate 21 and the SCH layer 22 are n-type and the SCH layer 24 and the cladding layer 25 are p-type in the present implementation, the p-type and the n-type may be opposite.

The semiconductor optical amplifier integrated laser 100 further includes one common functional layer 2 in the p-type cladding layer 25 of the p-i-n structure. The functional layer 2 is separated from the active layer 23 of the p-i-n structure. The functional layer 2 is constituted of a first portion 4 and a second portion 3. The functional layer 2 has a different composition than that of the p-type cladding layer 25. Here, the functional layer 2 is composed of InGaAsP. As will be described later, the functional layer 2 is composed of a film formation region and a non-film formation region, the film formation region is InGaAsP, and the non-film formation region is the same p-InP as the p-type cladding layer 25.

As shown in FIGS. 1 and 2, the first portion 4 and the second portion 3 include openings. In other words, the first portion 4 and the second portion 3 include, in a plan view, a first region where a layer is formed (hereinafter, referred to as a "film formation region") and a second region where a layer is not formed (hereinafter, referred to as "non-film formation region"). In the first portion 4, the film formation region and the non-film formation region are periodically provided to reflect light having a specific wavelength within the gain band of the p-i-n structure (first grating structure). With the present grating structure, the semiconductor laser oscillator portion 20 oscillates laser light having a single oscillation wavelength (DFB wavelength). In general, a grating structure that oscillates at a wavelength near the peak of the gain band is provided. In the present implementation, the first portion 4 is a floating type grating, has a grating period of 200 nm to oscillate at 1.3 μm, and has a duty ratio of 50%. That is, in a plan view of the first portion 4, the area ratio of the film formation region to the non-film formation region is 1:1.

On the other hand, the second portion 3 is provided with an opening so as not to reflect light having a wavelength within the gain band of the p-i-n structure (to transmit light in the gain band). That is, in the second portion 3, the film formation region and the non-film formation region are provided so as not to reflect (to transmit) light having a wavelength within the gain band of the p-i-n structure (second grating structure). In the first portion 4 and the second portion 3, it is preferable that the ratio of the area of the film formation region to the area of the non-film formation region (aperture ratio) is substantially the same. That is, in a plan view of the functional layer 2, it is preferable that the ratio of the total area of the film formation regions to the total area of the non-film formation regions in the first portion 4, and the ratio of the total area of the film formation regions to the total area of the non-film formation regions in the second portion 3 are substantially the same. In the present implementation, in a plan view of the functional layer 2, the difference between the ratio of the total area of the film formation regions to the total area of the non-film formation regions in the first portion 4, and the ratio of the total area of the film formation regions and the ratio of the total area of the non-film-forming regions in the second portion 3 is within 10%. Although the structure of the second portion 3 is referred to as a grating here for convenience, it does not reflect light having a wavelength within the gain band as described above.

In the present implementation, the second portion 3 includes the film formation region and the non-film formation region periodically but is configured not to reflect light having a wavelength within the gain band of the p-i-n structure of the semiconductor optical amplifier integrated laser 100. In addition, the second portion 3 has a structure (grating structure) in which the film formation regions and the non-film formation regions are alternately arranged at the same period, but the film formation regions and the non-film formation regions of the second portion 3 may not be formed at the same period (see FIG. 5). If the second portion 3 has a structure in which the film formation regions and the non-film formation regions are alternately arranged at the same period, the duty ratio of the first portion 4 may be 1.1 times or more or 0.9 times or less of the duty ratio of the second portion 3, in consideration of the wavelength range of the gain spectrum of InGaAsP or InGaAlAs forming the active layer 23.

The inside of the semiconductor laser oscillator portion 20 including the first portion 4 that functions as a grating may be, for example, a uniform grating type DFB-LD that forms a grating of the same period over the entire DFB-LD, a λ/4 shift DFB-LD in which a phase shift of a grating phase π is introduced in the middle of the grating, corrugation pitch modulated (CPM) -DFB-LD in which a phase shift equivalent to λ/4 is realized by slightly changing the grating period, a multi-phase shift DFB-LD in which a λ/4 shift is realized by a plurality of phase shifts, or the like.

When the second portion 3 has a periodicity, a period that does not reflect the light of the DFB wavelength may be required. In addition, in order to suppress DFB mode oscillation at an unintended wavelength, the second portion 3 preferably has a period and a diffractive structure with no reflection over the entire wavelength band in which the active layer 23 has a gain.

Referring to FIG. 3, the mesa unit 1 includes the first conductivity type substrate 21 and the p-i-n structure provided on the first conductivity type substrate 21. In the present implementation, the p-i-n structure includes the first conductivity type SCH layer 22, the active layer 23, the second conductivity type SCH layer 24, and the second conductivity type cladding layer 25, but the present disclosure is not limited thereto. The mesa unit 1 further includes the first portion 4 formed in a second conductivity type semiconductor layer of the p-i-n structure. The first portion 4 functions as a grating that reflects light of the oscillation wavelength of the active layer 23.

Referring to FIG. 4, the mesa unit 1 includes the first conductivity type substrate 21 and the p-i-n structure provided on the first conductivity type substrate 21. In the present implementation, the p-i-n structure includes the first conductivity type SCH layer 22, the active layer 23, the second conductivity type SCH layer 24, and the second conductivity type cladding layer 25, but the present disclosure is not limited thereto. The mesa unit 1 further includes the second portion 3 formed in the p-type semiconductor layer of the p-i-n structure. The second portion 3 does not reflect (transmits) light having a wavelength within the gain band of the active layer 23.

Figure 5:
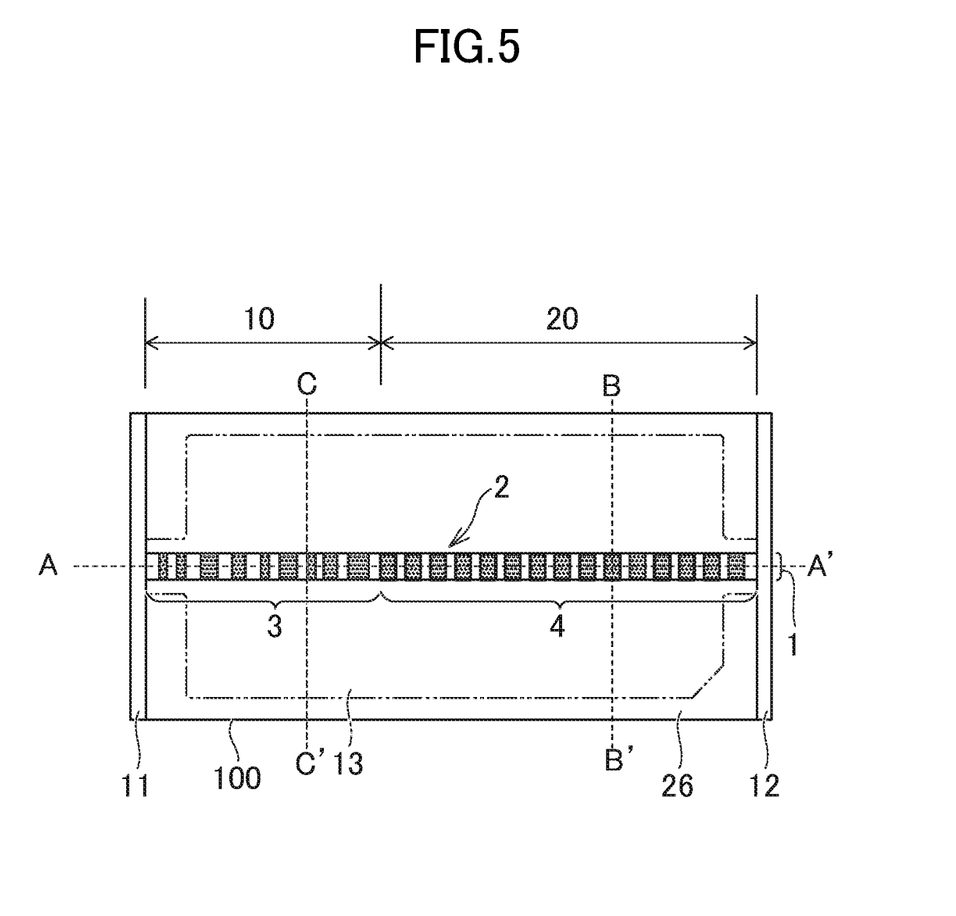
FIG. 5 is an example of a plan view of a semiconductor optical amplifier integrated laser according to a modification.

FIG. 5 shows an example of a plan view of a semiconductor optical amplifier integrated laser according to a modification. The modification shown in FIG. 5 is the same as the implementation shown in FIGS. 1 to 4 except for the second portion 3. More specifically, in FIG. 5, the second portion 3 does not form a structure in which film formation regions and non-film formation regions are alternately arranged at the same period. That is, the film formation regions and the non-film formation regions in the second portion 3 are not provided periodically. Further, in this modification, the areas of the film formation region and the non-film formation region may be non-uniform. However, the difference between the aperture ratio of the second portion 3 and the aperture ratio of the first portion 4 is within 10% in a plan view.

As described above, the semiconductor optical amplifier portion 10 and the semiconductor laser oscillator portion 20 have one common structure except for the functional layer 2. Therefore, the semiconductor optical amplifier portion 10 and the semiconductor laser oscillator portion 20 have substantially the same gain band. Further, since the electrodes 13 and 14 are each made of one member, the same voltage is applied to the semiconductor optical amplifier portion 10 and the semiconductor laser oscillator portion 20. Carriers are injected into the semiconductor optical amplifier portion 10 and the semiconductor laser oscillator portion 20 by applying a voltage to the semiconductor optical amplifier portion 10 and the semiconductor laser oscillator portion 20. After carrier injection, the semiconductor optical amplifier portion 10 and the semiconductor laser oscillator portion 20 cause radiative recombination.

The semiconductor optical amplifier integrated laser of the present application includes the first portion 4 functioning as a grating layer in the semiconductor laser oscillator portion 20, and the second portion 3 in the semiconductor optical amplifier portion 10. Since the first portion 4 has a high reflectance for a specific wavelength within the gain band, the semiconductor laser oscillator portion 20 oscillates light of a single wavelength. On the other hand, the second portion 3 does not reflect light having a wavelength within the gain band (does not cause Bragg reflection) and thus does not return light having a wavelength within the gain band including the DFB light. Therefore, the semiconductor optical amplifier portion 10 amplifies the laser light (DFB light) output from the semiconductor laser oscillator portion 20.

Since the aperture ratios of the first portion 4 and the second portion 3 are substantially the same, the diffusion profile of the second conductivity type dopant in the semiconductor laser oscillator portion and the semiconductor optical amplifier portion is substantially the same within the range of manufacturing variations. Therefore, the diffusion profile of the second conductivity type dopant can be optimized for both the semiconductor laser oscillator portion 20 and the semiconductor optical amplifier portion 10 at the same time. As a result, improvement of the characteristics of the semiconductor optical amplifier integrated laser of the present application is realized.

Further, since the aperture ratios of the first portion 4 and the second portion 3 are substantially the same, the density of the current injected into the active layer 23 of each of the semiconductor laser oscillator portion 20 and the semiconductor optical amplifier portion 10 is substantially the same within the range of manufacturing variations. Therefore, the difference in current density between the semiconductor laser oscillator portion 20 and the semiconductor optical amplifier portion 10 can be reduced as compared with the semiconductor optical amplifier integrated laser in which the semiconductor optical amplifier portion 10 does not include the second portion. As a result, the operational reliability of the semiconductor optical amplifier integrated laser of the present application is improved as compared with the conventional semiconductor optical amplifier integrated laser in which the semiconductor optical amplifier portion 10 does not include the second portion.

Figure 6:
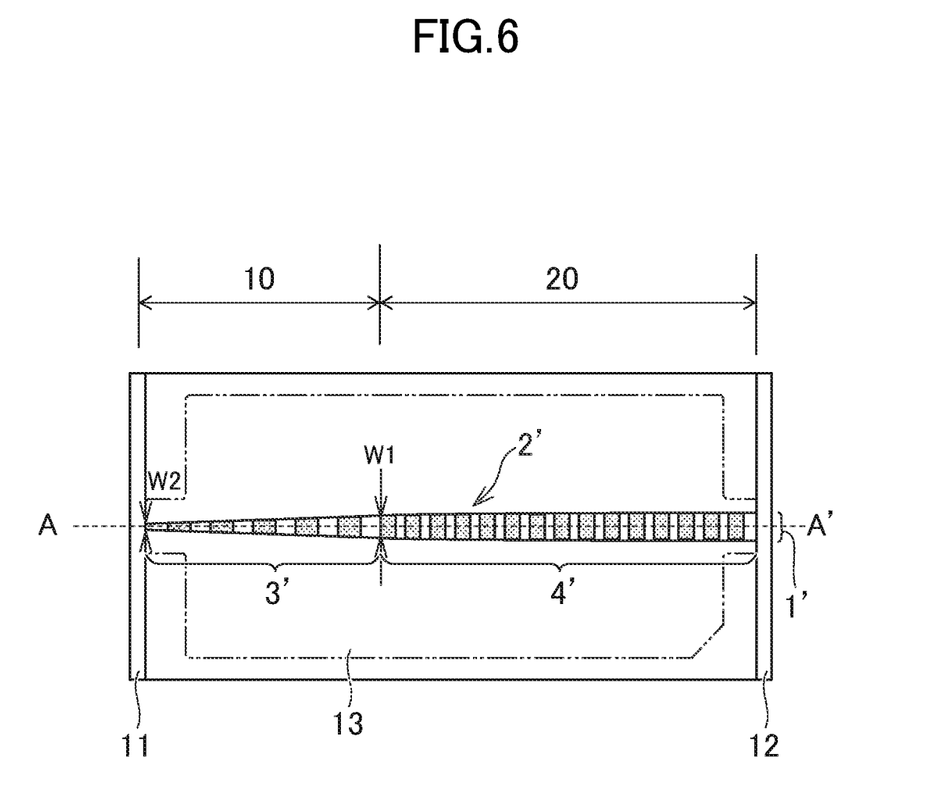
FIG. 6 is an example of a plan view of a semiconductor optical amplifier integrated laser according to a second example.
Figure 7:
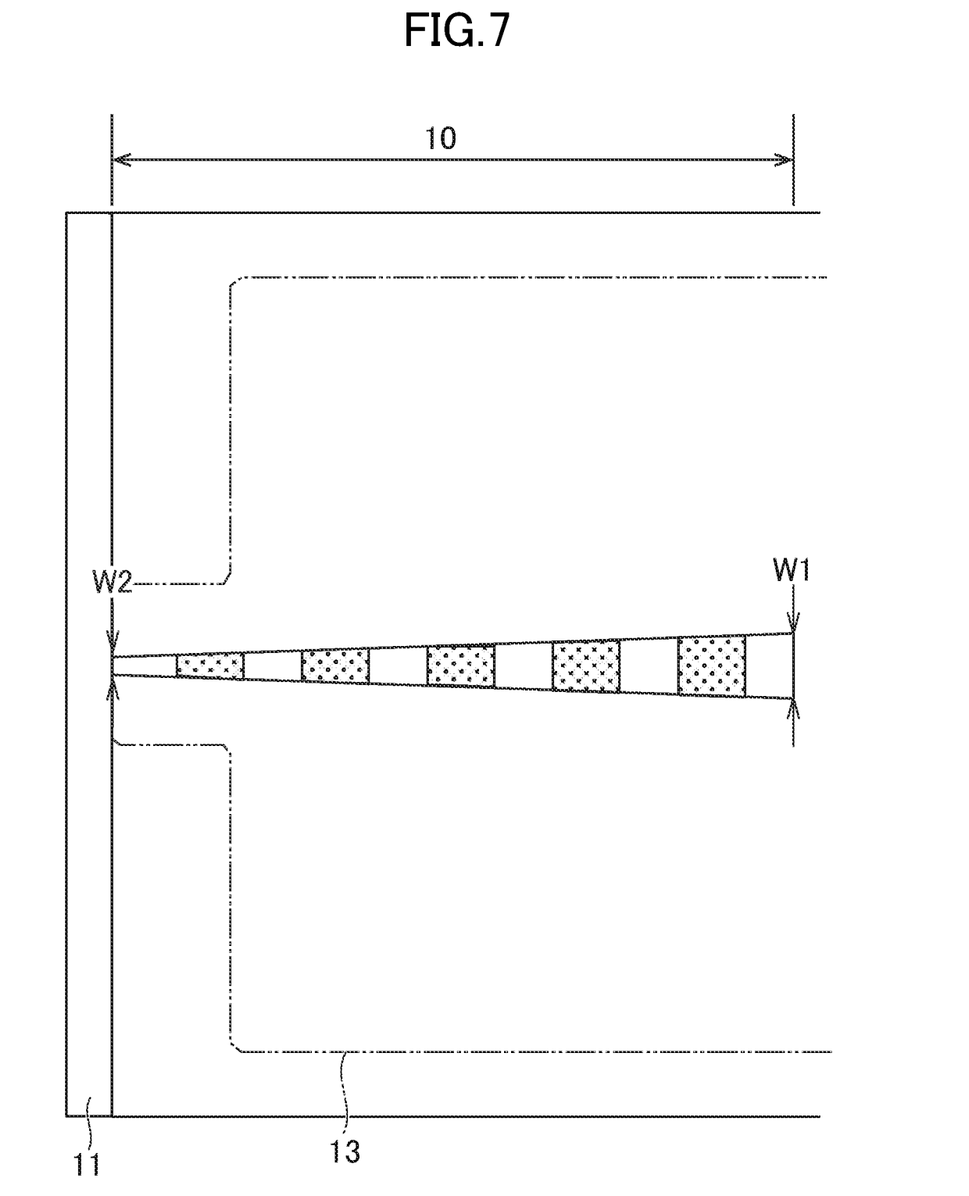
FIG. 7 is an enlarged plan view of a semiconductor optical amplifier portion of the semiconductor optical amplifier integrated laser of FIG. 6.

FIG. 6 is a plan view of the semiconductor optical amplifier integrated laser according to a second implementation. FIG. 7 is an enlarged plan view of the semiconductor optical amplifier portion of the semiconductor optical amplifier integrated laser of FIG. 6. The semiconductor optical amplifier integrated laser shown in FIG. 6 is the same as the semiconductor optical amplifier integrated laser of FIG. 1 except that the width of a mesa unit 1' changes. As in the implementation shown in FIGS. 1 to 5, the solid line defining the mesa 1' represents the contour of the mesa 1', and a common p-i-n structure is formed below the mesa 1'.

In the first domain, the mesa unit 1' includes a near end in contact with the second domain 20 and a far end in contact with the low reflection end surface coating film 11. As shown in FIG. 7, the far end mesa stripe width W1 is narrower than the near end mesa stripe width W2. As shown in the drawing, the mesa stripe width of the mesa unit 1' is gradually narrowed in the first domain from the near end to the far end. Therefore, the mesa unit 1' has a function as a spot size converter (SSC).

By making the width of the far end of the mesa unit 1' narrower than the width of the near end, the photon distribution distributed around the active layer becomes relatively wide, and the far field pattern (FFP) can be narrowed. In the present implementation, the width at the far end is 0.8 times or less the width at the near end in a plan view of the semiconductor optical amplifier integrated laser. Conversely, the width at the far end may be wider than the width at the near end. For example, the width of the far end is 1.2 times or more the width of the near end in a plan view of the semiconductor optical amplifier integrated laser.

Figure 8:
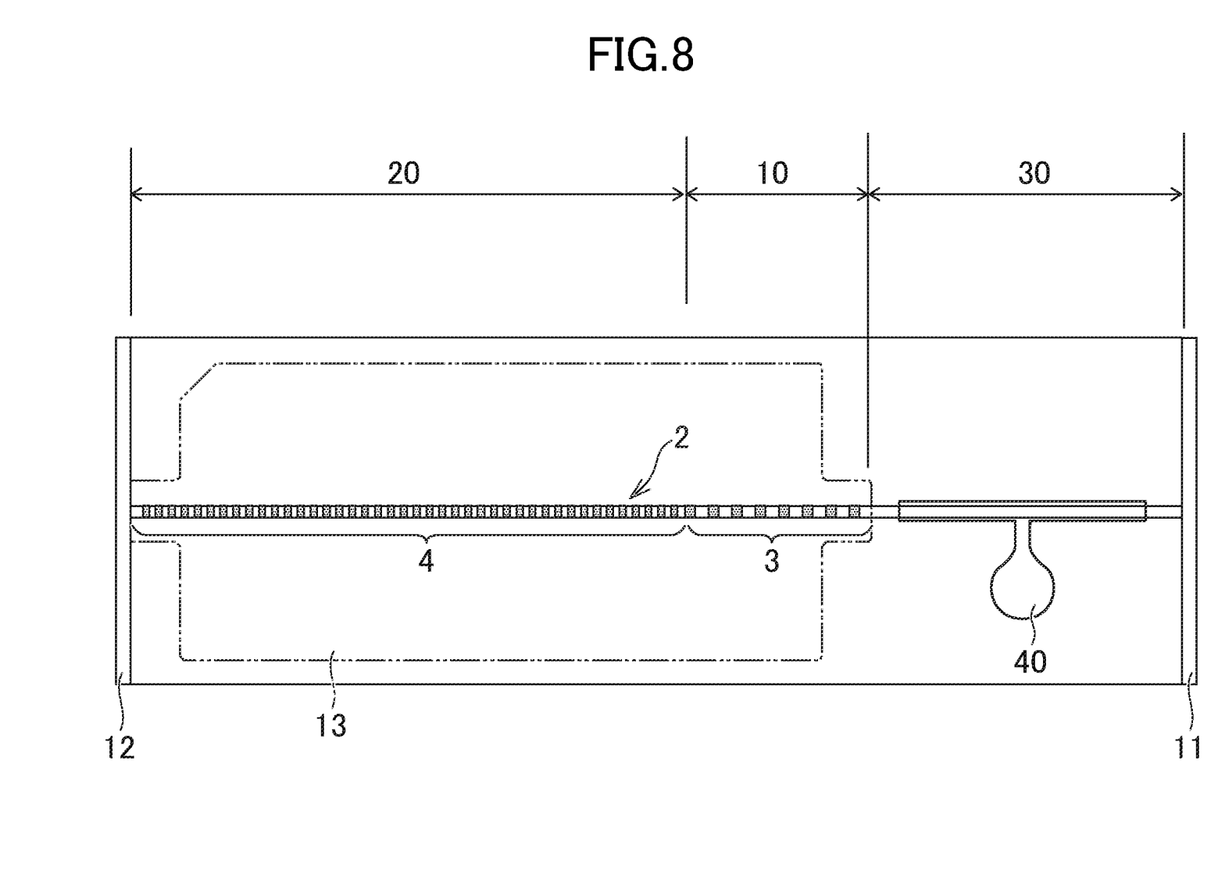
FIG. 8 is an example of a plan view of a semiconductor optical amplifier integrated laser in which a modulator is integrated.

FIG. 8 shows a plan view of an example of a semiconductor optical amplifier integrated laser in which a modulator is integrated. The semiconductor optical amplifier integrated laser shown in FIG. 8 is the same as the semiconductor optical amplifier integrated laser of FIG. 1 except that a semiconductor modulator portion 30 is provided. The semiconductor optical amplifier integrated laser includes the semiconductor laser oscillator portion 20 that oscillates light having a predetermined wavelength, the semiconductor optical amplifier portion 10 that amplifies the laser-oscillated light, and the semiconductor modulator portion 30 that modulates the amplified laser light. The semiconductor modulator portion 30 includes an electrode 40. The semiconductor modulator portion 30 modulates the light output from the semiconductor optical amplifier portion 10 by applying a voltage (modulation signal) to the electrode 40, and the modulated light is output from the emission surface on which the low reflection end surface coating film 11 is formed. The semiconductor modulator portion 30 may be an electro-absorption modulator or an MZ modulator.

The foregoing disclosure provides illustration and description, but is not intended to be exhaustive or to limit the implementations to the precise forms disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A semiconductor optical amplifier integrated laser comprising:
a semiconductor laser oscillator portion that oscillates laser light having a wavelength included in a gain band; and
a semiconductor optical amplifier portion that amplifies laser light output from the semiconductor laser oscillator portion, wherein
the semiconductor laser oscillator portion and the semiconductor optical amplifier portion have one common p-i-n structure,
the common p-i-n structure includes an active layer, a cladding layer provided apart from the active layer, and a common functional layer formed in the cladding layer, and
the common functional layer includes a first portion that reflects light having the wavelength within the gain band in the semiconductor laser oscillator portion and a second portion that transmits light having the wavelength within the gain band in the semiconductor optical amplifier portion.

2. The semiconductor optical amplifier integrated laser of claim 1, wherein
the common functional layer further includes a first region where a layer is formed and a second region where a layer is not formed, and
in a plan view of the common functional layer, a difference between a ratio of an area of the first region to an area of the second region in the first portion and a ratio of an area of the first region and an area of the second region in the second portion is within 10%.

3. The semiconductor optical amplifier integrated laser of claim 1, wherein
the first portion has a first grating structure that reflects light having the wavelength within the gain band, and
the second portion has a second grating structure that transmits light having the wavelength within the gain band.

4. The semiconductor optical amplifier integrated laser of claim 3, wherein a period of the second grating structure is 1.1 times or more or 0.9 times or less of the period of the first grating structure.

5. The semiconductor optical amplifier integrated laser of claim 1, wherein
the common p-i-n structure is formed by a mesa structure.

6. The semiconductor optical amplifier integrated laser of claim 5, further comprising:
a buried semiconductor layer embedding both sides of the mesa structure.

7. The semiconductor optical amplifier integrated laser of claim 1, wherein the cladding layer has a different composition than that of the common functional layer.

8. The semiconductor optical amplifier integrated laser of claim 1, further comprising:
an electrode for injecting a current into the semiconductor laser oscillator portion and the semiconductor optical amplifier portion.

9. The semiconductor optical amplifier integrated laser of claim 1, wherein
the semiconductor optical amplifier portion includes a near end in contact with the semiconductor laser oscillator portion and a far end farthest from the semiconductor laser oscillator portion, and
in a plan view of the semiconductor optical amplifier integrated laser, a width of the far end is 1.2 times or more or 0.8 times or less a width of the near end.

10. The semiconductor optical amplifier integrated laser of claim 1, further comprising:
a modulator portion that modulates the laser light oscillated by the semiconductor laser oscillator portion.

11. The semiconductor optical amplifier integrated laser of claim 1, wherein the cladding layer is p-type.

12. A semiconductor optical amplifier integrated laser comprising:
a substrate having a first conductivity type;
an active layer formed on a first surface of the substrate;
a second conductivity type cladding layer formed on the active layer;
a common functional layer formed in the second conductivity type cladding layer and separated from the active layer;
a first conductivity type electrode provided on a second surface opposite to the first surface; and
a second conductivity type electrode provided on the second conductivity type cladding layer,
wherein the semiconductor optical amplifier integrated laser includes a first domain and a second domain optically connected to the first domain,
wherein the common functional layer includes a first portion that reflects light having a specific wavelength within a gain band of the active layer in the first domain and a second portion that transmits light having the specific wavelength within the gain band of the active layer in the first domain, and
wherein the second portion amplifies light from the first portion.

13. The semiconductor optical amplifier integrated laser of claim 12, wherein:
the common functional layer includes a first region where a layer is formed and a second region where a layer is not formed, and
in a plan view of the common functional layer, a difference between a ratio of an area of the first region to an area of the second region in the first portion and a ratio of an area of the first region to an area of the second region in the second portion is within 10%.

14. The semiconductor optical amplifier integrated laser of claim 12, wherein:
the first portion has a first grating structure that reflects light having the specific wavelength within the gain band of the active layer, and
the second portion has a second grating structure that transmits light having the specific wavelength within the gain band of the active layer.

* * * * *